(12) United States Patent
Chng et al.

(10) Patent No.: US 11,960,268 B2
(45) Date of Patent: Apr. 16, 2024

(54) POWER ALLOCATION TO HEAT A PROCESSING CHIP OF A NETWORK DEVICE

(71) Applicant: Hewlett Packard Enterprise Development LP, Houston, TX (US)

(72) Inventors: Khai Chiah Chng, Singapore (SG); Mun Hoong Tai, Singapore (SG); Kum Cheong Adam Chan, Singapore (SG); Song Poh Chai, Singapore (SG)

(73) Assignee: Hewlett Packard Enterprise Development LP, Spring, TX (US)

( * ) Notice: Subject to any disclaimer, the term of this patent is extended or adjusted under 35 U.S.C. 154(b) by 422 days.

(21) Appl. No.: 17/307,430

(22) Filed: May 4, 2021

(65) Prior Publication Data
US 2022/0357720 A1    Nov. 10, 2022

(51) Int. Cl.
*G05B 19/4155* (2006.01)
*G06F 1/18* (2006.01)
(Continued)

(52) U.S. Cl.
CPC ......... *G05B 19/4155* (2013.01); *G06F 1/182* (2013.01); *G06F 1/206* (2013.01);
(Continued)

(58) Field of Classification Search
CPC . G06F 1/182; G06F 1/206; G06F 1/26; H01L 23/345; H01L 23/367;
(Continued)

(56) References Cited

U.S. PATENT DOCUMENTS

| 8,704,630 B2 * | 4/2014 | Melvin, Jr. ........ G05B 23/0289 |
| | | 219/490 |
| 10,236,193 B2 | 3/2019 | Singh et al. |

(Continued)

FOREIGN PATENT DOCUMENTS

| CN | 106773650 A | 5/2017 |
| CN | 106104795 B | 3/2019 |

OTHER PUBLICATIONS

Wu, Y., et al., "Optimization of Temperature Uniformity of a Serpentine Thin Film Heater by a Two-dimensional Approach," Microsystem Technologies, May 4, 2018, 14 Pgs.

*Primary Examiner* — Ji H Bae
(74) *Attorney, Agent, or Firm* — Hewlett Packard Enterprise Patent Department (57) ABSTRACT

Examples discussed herein relate to managing power allocation for devices, such as network devices, with processing chip. In some examples, based on determining that a first temperature measurement of the processing chip does not satisfy an operating temperature threshold, the network device allocates power from a power source to a first heating element of the network device to heat the processing chip & allocates power from the power source to a second heating element of the network device to heat the processing chip. Based on determining that a second temperature measurement satisfies the operating temperature threshold, the network device allocates power from the power source to a set of power over ethernet ports of the network device & the first amount of power from the power source selectively to the first heating element to heat the processing chip.

20 Claims, 6 Drawing Sheets

(51) Int. Cl.
  *G06F 1/20* (2006.01)
  *G06F 1/26* (2006.01)
  *H01L 23/34* (2006.01)
  *H01L 23/367* (2006.01)
  *H05K 1/02* (2006.01)
  *H05K 1/18* (2006.01)
  *H05K 7/20* (2006.01)

(52) U.S. Cl.
  CPC .............. *G06F 1/26* (2013.01); *H01L 23/345* (2013.01); *H01L 23/367* (2013.01); *H05K 1/0203* (2013.01); *H05K 1/181* (2013.01); *H05K 7/2039* (2013.01); *G05B 2219/49216* (2013.01); *H05K 2201/066* (2013.01)

(58) Field of Classification Search
  CPC .... H05K 1/0203; H05K 1/181; H05K 7/2039; H05K 2201/066; G05B 19/4155; G05B 2219/49216
  USPC ......................................................... 713/300
  See application file for complete search history.

(56) References Cited

U.S. PATENT DOCUMENTS

| | | |
|---|---|---|
| 2019/0215951 A1* | 7/2019 | Severson ................. H05K 3/34 |
| 2019/0310216 A1 | 10/2019 | Shim et al. |
| 2020/0258804 A1 | 8/2020 | Haswarey et al. |
| 2022/0020660 A1* | 1/2022 | Ganta Papa Rao Bala ................. H01L 23/345 |
| 2022/0196728 A1* | 6/2022 | Mamchik ........... G01R 31/2877 |
| 2022/0322563 A1* | 10/2022 | Cui ...................... H05K 7/2039 |

* cited by examiner

POWER ALLOCATION TO HEAT A PROCESSING CHIP OF A NETWORK DEVICE

BACKGROUND

Traditionally, computing systems for data centers were deployed in locations far from the physical locations where data was generated. However, with the emergence of edge computing, computing systems are being deployed at or near physical locations where data is generated. Thus, there is a growing need for computing systems that can be deployed for various purposes and in different types of environments.

Network devices such as routers, switches, integrated access devices (IADs), and multiplexers, provide communications between various nodes (e.g., computing devices) of a networked computing system. In addition, network devices may provide other types of functions, such Power over Ethernet (PoE). PoE allows a network device to provide both power and data transmissions to connected devices using an Ethernet cable. Devices such as Voice over Internet Protocol (VoIP) phones, Light-Emitting Diode (LED) lights, Internet Protocol (IP) cameras, wireless Access Points (APs), and Bluetooth Low-Energy (BLE) beacons can be powered by PoE and can therefore be installed in locations where it would be impractical or expensive to install conventional wires used to provide power. In the Institute of Electrical and Electronics Engineers (IEEE) standards, a device that receives PoE is called a Powered Device (PD), while a device that provides PoE is called a Power Sourcing Equipment (PSE).

BRIEF DESCRIPTION OF THE DRAWINGS

The features, aspects, and advantages of the present subject matter will be better understood from the following detailed description read with accompanying drawings. Similar characters may represent similar parts throughout the drawings, wherein.

Various elements and features illustrated in the drawings may not be to scale and are used for illustration purposes only. In fact, the dimensions of the various features may be exaggerated or reduced for ease of discussion.

DETAILED DESCRIPTION

As edge computing gains prominence, there is a need to deploy computing systems at locations that have extreme operating conditions, such as extremely low ambient temperatures. As such, there is a need for network devices that are operable at extremely low ambient temperatures, e.g., as low as −40 degrees Celsius. However, network devices may include certain components, such as processing chips with commercial grade specifications, which require a minimum operating temperature, for example, 0 degrees Celsius. Thus, when a network device is deployed in extremely low ambient temperature conditions, there may be a requisite wait time for the processing chip of the device to attain its minimum operating temperature and to operate normally.

Further, although there are processing chips with industrial-grade specifications that can operate at lower minimum operating temperatures (e.g., −40 degrees Celsius temperature), the manufacture and inclusion of such industrial-grade chips in network devices may be impractical. For instance, migration from manufacturing of processing chips with commercial-grade specifications to chips with industrial-grade specifications is an expensive process and may warrant a redesign of manufacturing facilities, assembling facilities, etc. Moreover, board assemblies of network devices that support such processing chips and other associated components may also need to be redesigned or modified.

Alternatively, components of network devices, such as the processing chips, may be heated up to bring them to a minimum operating temperature. For instance, a heater may be used for heating a processing chip and to attain a minimum operating temperature for the processing chip. However, when a single heater is used, the wait time for bootup may be very high (e.g., 90 minutes), as the single heater that is of small capacity is used. Moreover, when a high capacity heater is used to rapidly increase the temperature of a processing chip, such rapid increase in temperature may cause thermal shock to the components, which in turn, may cause irrecoverable damage to the processing chip. Moreover, high capacity heater may utilize a substantial amount of power, which could otherwise be used for other operations of the network device such as PoE. To support the high capacity heater element the power source also has to be upgraded to a larger capacity. Moreover, network devices may incorporate heat sinks for dissipating heat from their heat-generating components, such as the processing chips. Such heat sinks may inhibit faster heating of the components, as the heat dissipating function of the heat sink contradicts the heating requirement. Thus, there is a need for addressing the aforementioned technical shortcomings.

Examples in accordance with the present subject matter described herein provide a network device for selectively allocating power to heat a processing chip. Power is allocated to a first heating element for heating the processing chip. Power may be allocated to a second heating element to expedite the heating process when required, e.g., when the computing system is installed in extremely low-temperature environments. Once the processing chip attains an operating temperature threshold, power is reallocated for the operation of the processing chip, to a set of ports of a plurality of PoE ports, and to other components of the computing system. The present subject matter enables the use of a processing chip with a commercial-grade specification in a network device, without the need for migrating to a chip with industrial-grade specifications. The term "processing chip" is used in singular form for brevity and by way of limitation.

In examples described herein, efficient heating of processing chip of a network devices is achieved, for instance, when operating the processing chip in extreme ambient temperature environments (especially, extremely low temperatures). Further power from the power source is efficiently utilized by incorporating two or more heating elements and by allocation of power to the heating elements without affecting power budget related to components of the network device, such as PoE ports, etc. Thus, the described method and/or configuration is efficient in power utilization for heating the processing chip for starting the system, as well as in dissipating heat from the system, as compared to available configurations. In some examples, the wait time for the processing chip to attain the operating temperature threshold (reach operating condition) is reduced by around ten times as compared to typical systems.

In some examples, a first temperature measurement may be received, by a control device. The control device may be part of the network device or part of an independent system. The control device may determine whether a first temperature measurement of a processing chip of a network device satisfies an operating temperature threshold. Based on determining that the first temperature measurement does not satisfy the operating temperature threshold, the network device allocates a first amount of power from a power source to a first heating element to heat the processing chip. The network device allocates a second amount of power from the power source to a second heating element to heat the processing chip. In one example, a predetermined delay between the allocation of the first amount of power and the second amount of power may be maintained to avoid thermal shock to the processing chip.

Further, the control device receives a second temperature measurement. The control device determines whether a second temperature measurement of the processing chip satisfies the operating temperature threshold. Based on determining that the second temperature measurement satisfies the operating temperature threshold, the network device allocates a third amount of power from the power source to a set of power over ethernet ports. In addition, the first amount of power from the power source is allocated to the first heating element to heat the processing chip, based on certain predefined conditions. For example, one predefined condition is, the processing chip may exhibit a fall in temperature (gradual, stepped, or sudden) reaching a temperature control range that indicates that the temperature of the processing chip may fall below the operating temperature threshold. In some examples, the second amount of power corresponding to the second heating element may be temporarily or permanently deallocated and the second amount power may be utilized for PoE and other system operation(s) by reallocation from the power source. In other words, the second amount of power is included in at least a portion of the third amount of power, as per one example. In some examples, a fourth amount of power is allocated for the operation of the system, i.e., the processing chip among other components. Other features and advantages of the present subject are provided in the following description.

As used herein, the term "disposed" may mean that an object or element is coupled to, deposited on, supported on, or grown on a surface of another object or element. In an example, an object or element may be disposed directly on a surface of another object or element with or without an intervening layer. As used herein, the term "coupled," as used herein, is defined as connected, whether directly without any intervening elements or indirectly with at least one intervening element, unless otherwise indicated. Two elements can be connected mechanically, electrically, or communicatively. As used herein, the term "thermally coupled" means that two elements may be in contact with each other or connected mechanically to transfer heat through conduction.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is to describe particular examples only and is not intended to be limiting. As used herein, the singular forms "a," "an," and "the" are intended to include the plural forms as well, unless the context indicates otherwise. The term "plurality," as used herein, is defined as two or more than two. The term "another," as used herein, is defined as at least a second or more. The term "and/or" as used herein refers to and encompasses any and all possible combinations of the associated listed items. It will also be understood that, although the terms first, second, etc. may be used herein to describe various elements, these elements should not be limited by these terms, as these terms are only used to distinguish one element from another unless stated otherwise or the context indicates otherwise.

Figure 1:
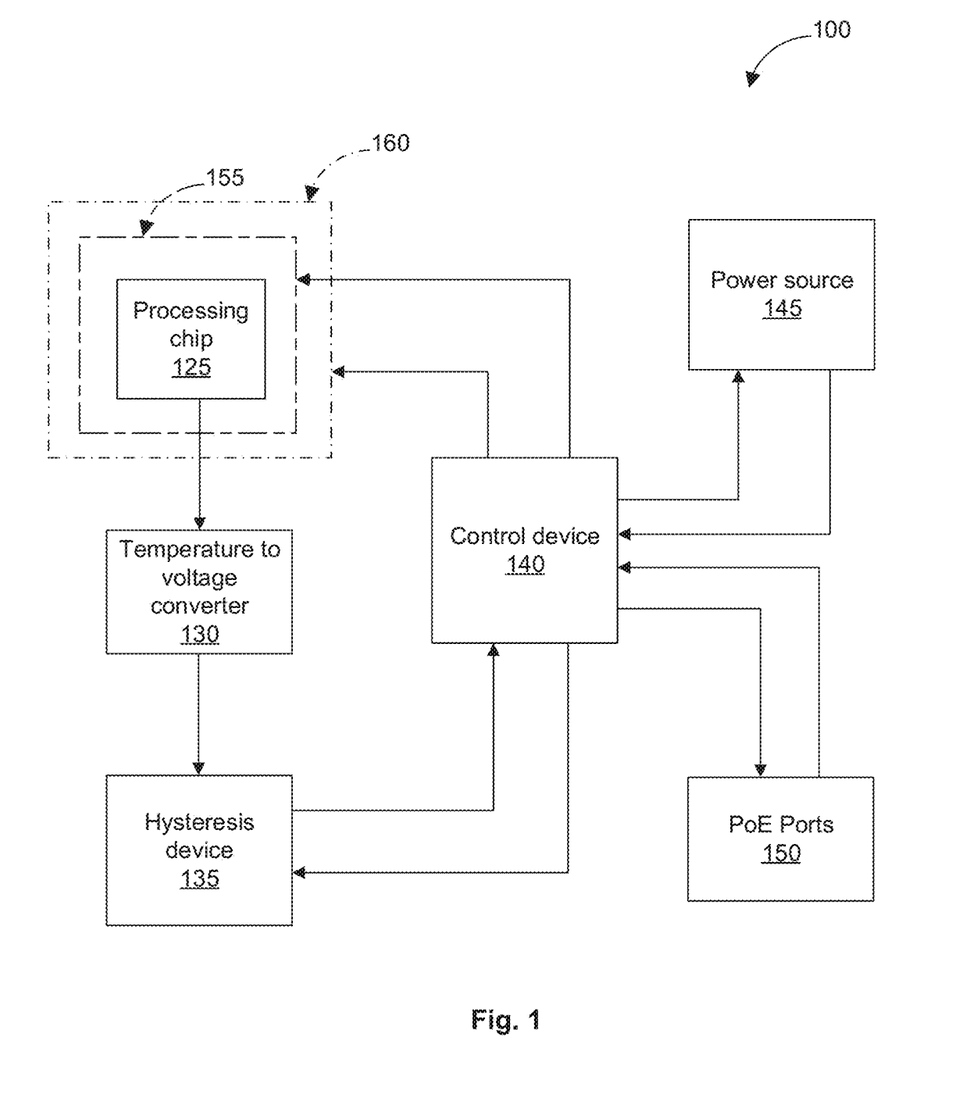
FIG. 1 is an exploded perspective view of a computing system, in accordance with an example of the present subject matter.

FIG. 1 illustrates a schematic block diagram of a network device 100, in accordance with an example of the present subject matter. The network device 100 may comprise one or more managed switches which support data link layer switching (i.e., Layer 2 or L2 switching), IP layer routing (i.e., Layer 3 or L3 routing), or a combination thereof. Moreover, the network device 100 may comprise one or more stackable or standalone type switches, modular or fixed configuration type switches, etc. It will be understood that the network device 100 may include one, two, or any suitable number of switches, and may include any suitable type(s) of switch(es), now known or later developed. In addition, the network device 100 may engage in any network data transmission operations, including, but not limited to, switching, routing, bridging, or a combination thereof.

In some examples, the network device 100 may comprise one or more computing devices. As used herein, a "computing device" may be a server, storage device, storage array, desktop or laptop computer, switch, router, gateway, controller, access point, or any other processing device or equipment including a processing resource.

The network device 100 comprises a processing chip 125 that is configured (encoded with instructions executable by at least one processing resource) to perform one or more generic or specific operations (e.g., arithmetic, logic, controlling, and input/output operations). In one example, the processing chip 125 is an independent element that is mounted to a circuit board assembly (not shown). The processing chip 125 has an operating temperature range and it may not operate when the processing chip 125 is at a temperature below a minimum operating temperature. In one example, the processing chip 125 has a minimum operating temperature of zero degrees Celsius (~32 degrees Fahrenheit). In addition, although FIG. 1 illustrates a single processing chip 125, it will be understood that network device 100 may include multiple processing chips. Moreover, processing chip 125 includes a processing resource, for example, a central processing unit (CPU), an application-specific integrated circuit (ASIC), a semiconductor-based microprocessor, a graphics processing unit (GPU), a field-programmable gate array (FPGA) configured to retrieve and execute instructions, other electronic circuitry suitable for the retrieval and execution instructions stored on a machine-readable storage medium, or a combination thereof. In examples described herein, a processing resource may fetch, decode, and execute instructions stored on a storage medium to perform the functionalities described in relation to the instructions stored on the storage medium. In other examples, the functionalities described in relation to any instructions described herein may be implemented in the form of electronic circuitry, in the form of executable instructions encoded on a machine-readable storage medium, or a combination thereof.

The network device 100 includes a converter unit, which is functionally coupled to the processing chip 125 for determining temperature. In one example, the converter unit is a temperature to voltage converter 130 to convert a measured temperature to a voltage signal. The voltage signal from the temperature to voltage converter 130 is fed to a hysteresis device 135. The hysteresis device 135 may be configured with a hysteresis setpoint between −5 degrees and 10 degrees Celsius. Further, the network device 100 comprises a control device 140. The control device 140 includes hardware or circuitry that is configured to (e.g., encoded with instructions executable by at least one processing resource) receive signal(s) corresponding to the temperature measurement of the processing chip 125, from the hysteresis device 135. In other words, the control device 140 receives temperature-related information of the processing chip 125 through the temperature to voltage converter 130 and the hysteresis device 135. The control device 140 is powered by a power source 145 and power allocation of network device 100 may be performed through the control device 140. The power source 145 is capable of powering one or more components including the processing chip 125 of the network device 100.

The network device 100 includes a plurality of Power over Ethernet (PoE) ports 150 and may operate as a PSE for one or more PDs. Each of the PoE ports may comprise an Ethernet port, wherein the Ethernet port may comprise any suitable physical interface circuitry and/or media dependent interface to provide PoE to a PD coupled to the Ethernet port. The network device 100 may comprise a chassis which includes the PoE ports in the chassis. It will be understood that network device 100 and the PoE interfaces may provide PoE data and/or power transmissions in conformity with any suitable type(s) of industry Ethernet standards, now known or later developed. For instance, network device 100 and the PoE interfaces may provide PoE data and/or power transmissions in conformity with one or more of IEEE 802.3af, IEEE 802.3at, IEEE 802.3bt, and Linear Technology (LT) PoE++, or any other suitable PoE industry standard. In some examples, PDs such as VoIP phones, LED lights, IP cameras, WAPs, and BLE surveillance cameras, audio and/or video devices, and storage devices may be connected to the network device 100 via the plurality of PoE ports 150 and be powered by the power source 145 of the network device. Such PDs may receive PoE power from the network device 100 in accordance with any suitable PoE industry standards.

The network device 100 comprises a first heating element 155 and a second heating element 160. In one example, the first heating element 155 and the second heating element 160 are disposed in the vicinity of the processing chip 125. In another example, the first heating element 155 and the second heating element 160 are coupled to the processing chip 125. When the temperature of the processing chip 125 is below the operating temperature threshold, then the control device 140 may allocate power from the power source 145 to operate the first heating element 155. The control device 140 may allocate power from the power source to operate the second heating element 160. The heat generated by the first heating element 155 and/or the second heating element 160 is transferred to the processing chip 125 for heating thereof. In one example, the second heating element 160 may be operated after a predetermined time delay from the operation of the first heating element 155 (or alternatively, the first heating element 155 may be operated after a predetermined time delay from the operation of the second heating element 160), thereby avoiding any thermal shock. Collectively, heating elements 155, 160 provide heat, which is utilized for quick heating of the processing chip 125.

A first amount of power is allocated to the first heating element 155, a second amount of power is allocated to the second heating element 160, and a minimal amount of power is allocated for basic operation of the network device 100—from the power source 145. For example, the minimal amount of power may be 1-3% of the total amount of power of the power source that may be used for bootup or boot startup of the processing chip (the basic operation). In a further example, the basic operation of the network device 100 includes the operation of the control device 140, the temperature to voltage converter 130, the hysteresis device 135, etc. Further, due to heat generated by heating elements 155, 160, the temperature of the processing chip 125 raises from the ambient temperature, and when the temperature reaches the operating temperature threshold, the control device 140 may disable or deallocate power (first amount power, second amount of power) to the first heating element 155 and the second heating element 160.

In one example, the processing chip 125 may undergo bootup or boot startup (a first condition) and reaches an operating state (a second condition). The control device 140 receives a second temperature measurement of the processing chip 125 and may determine whether the second temperature measurement satisfies the operating temperature threshold. Based on determining that the second temperature measurement satisfies the operating temperature threshold, the control device 140 allocates a third amount of power from the power source 145 to a set of PoE ports, out of the plurality of PoE ports. In one example, the set of PoE ports may correspond to ports among the plurality of PoE ports which have PDs connected to them. The control device 140 allocates a fourth amount of power to the processing chip 125. Moreover, the first amount of power may be allocated for operation of the first heating element 155. In some examples, the control device 140 may deallocate the second amount of power and at least a portion of the second amount of power may be included in the allocation of at least one of the third or fourth amounts of power. For example, the deallocated second amount of power may be used to form at least a portion of the third amount of power. In further examples, the first heating element 155 is selectively operated to maintain the temperature of the processing chip 125 within the operating temperature range or when the temperature falls within a temperature control range. In another example, the second heating element may be of the same or of a lower heating capacity compared to the first heating element, and consequentially, the second amount of power is the same as or less than the first amount of power (measured over the same time period). In some examples, the operating temperature range of the processing chip may be 0-155 degrees Celsius. In some other examples, processing chip may even have a higher limit of the operating temperature.

In some examples, a sum of the first, third, and fourth amounts of power (related to the second condition) is greater than a sum of the first and second amounts of power (related to the first condition).

Furthermore, in one example, the network device 100 comprises a high accuracy analog output temperature sensing circuit (for brevity, referred to as 'temperature sensing circuit'), a comparator circuit, and a switching circuit. The temperature sensing circuit may be functionally coupled to the processing chip 125 to convert the temperature to a voltage signal. The temperature sensing circuit may be provided with a reference voltage that is proportionate to the operating temperature threshold. The reference voltage may be varied by the user to set a desired operating temperature threshold corresponding to the processing chip being used. The output of the temperature sensing circuit is provided to the comparator circuit. The comparator circuit is provided with another reference voltage. Based on the reference voltage and the output of the temperature sensing circuit, the comparator provides an output. The output of the comparator circuit may be used to operate the switching circuit. The switching circuit is used to operate at least one of the first heating element and the second heating element. Based on certain predefined conditions, the first heating element and/or the second heating element may be operated.

Figure 2A:
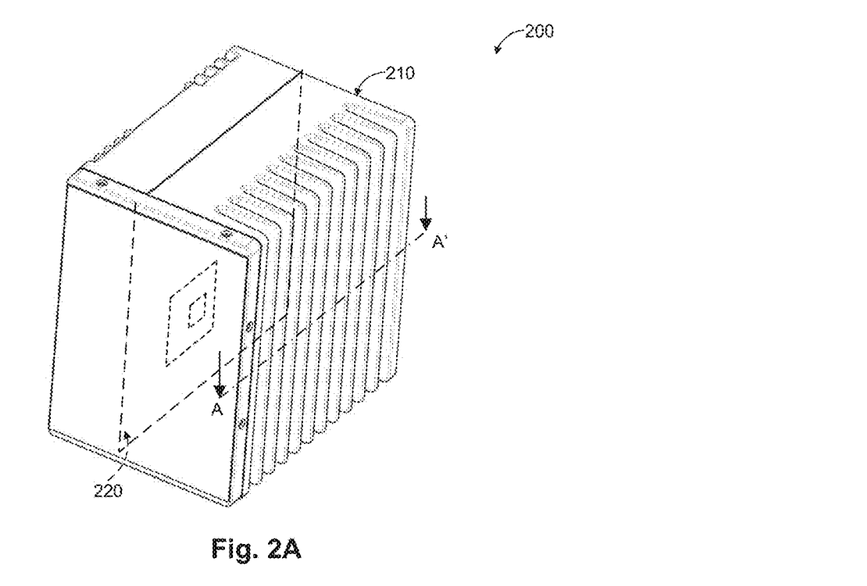
FIG. 2A illustrates a schematic perspective of a network device, in accordance with an example of the present subject matter.
Figure 2B:
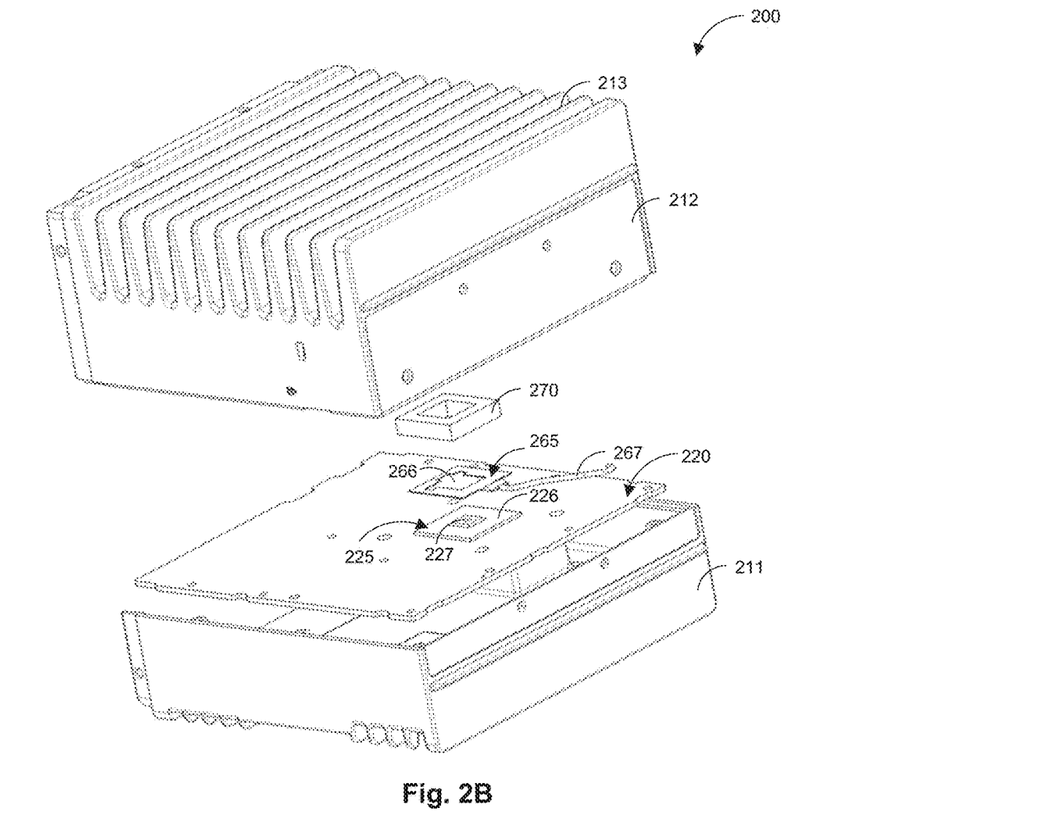
FIG. 2B illustrates a schematic exploded view of a network device, in accordance with an example of the present subject matter.

FIGS. 2A and 2B illustrate a perspective view and an exploded view, respectively, of a network device 200, according to an example of the present subject matter. The exploded view (FIG. 2B) illustrates selected components and may comprise other parts or components, which may not be depicted in the illustration. In one example, the network device 200 may be a network switch with data routing capabilities. The network device 200 may be responsible, inter alia, for routing data along a route in a network (not shown). The network may comprise other network devices, one or more nodes, one or more routers, one or more client devices, etc. In one example, the network device 200 includes a housing 210. The housing 210 houses various components, ports, wiring harnesses, etc. of the network device 200. The housing 210 acts as a heat sink for dissipating heat generated by one or more components of the network device 200, which includes the circuit board assembly 220. In other words, the housing 210 may serve a dual function of supporting and encasing one or more components of the network device 200, and dissipating heat generated from one or more components of the network device 200.

In the illustrated examples (of FIGS. 2A & 2B), housing 210 comprises a first portion 211 and a second portion 212. In an assembled condition, the first portion 211 and the second portion 212 may form an enclosure. The first portion 211 is configured to support the circuit board assembly 220 and the second portion 212. When mounted to the first portion 211, the second portion 212 encloses the circuit board assembly 220 and other components of the network device 200. In one example, the circuit board assembly 220 is mounted to a floor of the housing 210 via standoffs and fasteners. The processing chip and other electronic/electrical components may be mounted to the main circuit board via a permanent type of mounting, such as a soldered connection in which external terminals or pads of the components are soldered to traces of the main circuit board. Certain other of these components may be directly or indirectly mounted to the main circuit board via a removable mounting, such as a mounting in which the external terminals or pads of the components are inserted into a slot connector or socket, which has, for example, spring-like electrical contacts. As used in this context, "direct" mounting to the main circuit board means that a component is mounted to the circuit board without any intervening circuit board being between the component and the circuit board. As used in this context, "indirect" mounting may mean that a component is being mounted to another circuit board that is being directly or indirectly mounted to the main circuit board. The circuit board assembly 220 may include one or more heat-dissipating components that, during their operation, may produce heat. The heat dissipated by these components may be transferred to a heat sink through conduction, and from the heat sink, the heat may be dissipated to the surrounding environment/atmosphere via convection.

In some examples, the processing chip 225 may include a substrate 226, and a die 227 disposed on the substrate 226. The substrate may be secured to the circuit board assembly 220. The substrate 226 may include a substantially planar body (i.e., flat) of any shape, having a substantially uniform thickness. In the illustrated example, the substrate 226 may be rectangular in shape. In some examples, the substrate may have polygonal, circular, elliptical, or any other known regular or irregular geometrical shape. In one example, the die 227 may be disposed at an elevation from the substrate 226.

Further, a heater assembly 265 is provided in the vicinity of the processing chip 225. In one example, the heater assembly 265 has a substantially planar shape. The term "substantially planar shape" as used in the current context implies that at least 80% of the profile is having a uniform thickness or planar shape. The heater assembly 265 comprises an aperture portion 266 provided at a center thereof. In an assembled condition, the heater assembly 265 at least partially may be seated on the substrate and it surrounds an outer peripheral portion of the die 227. In one example, at least a portion of the aperture portion 266 may conform to an outer periphery of the die 227. In some examples, the heater assembly 265 may be adhered to the substrate 226 via any know heat-resistive additive. The heater assembly 265 encompasses a first heating element and a second heating element for heating the processing chip 225. The heater assembly 265 comprises a wiring harness 267, which couples the first heating element and the second heating element to a control device, which controls power allocation and switching operation of the heating elements. Further, a heat-insulating member 270 is disposed atop the heater assembly 265 for limiting the escape of heat and for retention of heat.

Figure 3A:
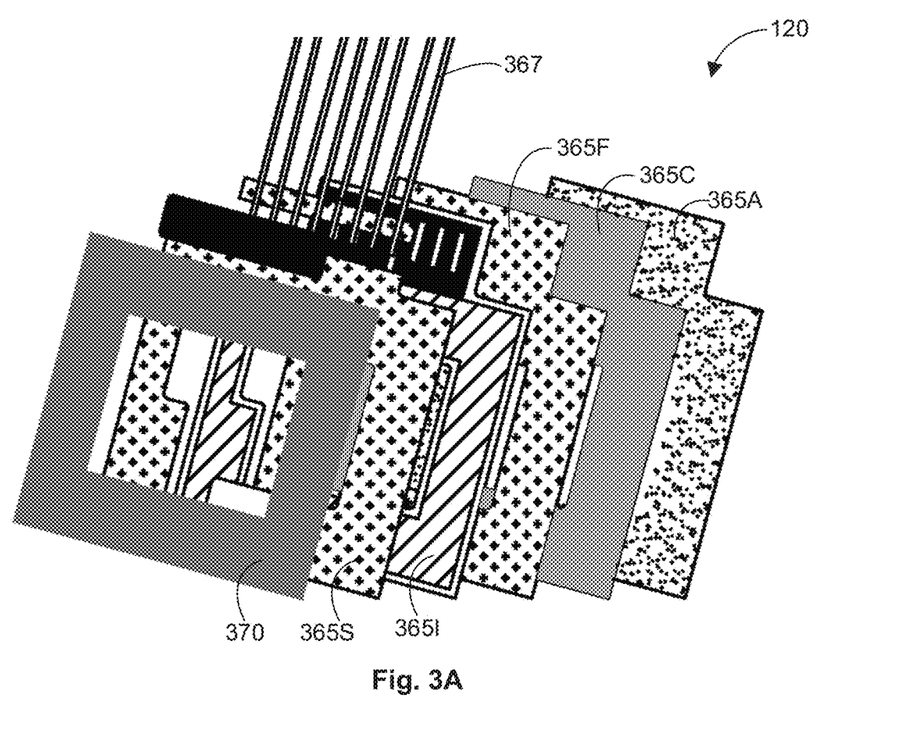
FIG. 3A illustrates a schematic exploded view of a heater assembly, in accordance with an example of the present subject matter.

FIG. 3A illustrates a schematic exploded view of the heater assembly, in accordance with an example of the present subject. The heater assembly 365 comprises a plurality of layers. The heater assembly 365 comprises an integrated support layer 365I, which supports a first heating element and a second heating element (for example, 355, 360 illustrated and discussed in FIG. 3B). In one example, the heater assembly 365 comprises a first heat-resistive layer 365F and second heat-resistive layer 365S. The integrated support layer 365I, the first heating element, and the second heating element are sandwiched between the first heat-resistive layer 365F and the second heat-resistive layer 365S. A conductive AP layer 365C is provided to spread heat generated by any of the heating elements. The first heat-resistive layer 365F acts as electrical insulation between the integrated support layer 365I and a conductive layer 365C. Thus, the first heat-resistive layer 365F eliminates any electrical short between the first heating element and the second heating element via the conductive layer 365C but allows propagation of heat from the heating elements to the conductive layer 365C. The term "heat-resistive" used in this context implies that the layer is capable of withstanding heat and enables propagation of heat through it. In one example, the heat-resistive layers 365F, 365S are made from a polymer with high heat resistance. The heat-resistive layer may be in the form of film, sheet, or membrane.

Further, the integrated support layer 365I is disposed along a first (imaginary) plane, and the first heating element and the second heating element are disposed substantially along the first plane. The integrated support layer 365I is discussed in detail in FIG. 3B. The conductive layer 365C is coupled to the integrated support layer 365I and is disposed adjacent to and in planar contact with the first heat-resistive layer 365F. The conductive layer 365C is coupled to the first heating element and the second heating element, for the spread of heat about the conductive layer 365C, when at least one of the first heating element and the second heating element is operational. The heater assembly 365 is coupled to the processing chip through an adhesive layer 365A.

In other words, as per one example, the conductive layer 365C, the first heat-resistive layer 365F, the integrated support layer 365I, and the second heat-resistive layer 365S are disposed in the listed order. The heat generated by the heating elements is spread about the conductive layer 365C and heat is applied to the processing chip for heating thereof. Heat concentration at a certain portion or region is reduced or eliminated. Further, the heat-insulating member 370 provided atop the heater assembly 365 may be in planar contact with the second heat-resistive layer 365S. The heat-insulating member 370 prevents heat from escaping from an outward-facing planar side of the heater assembly 365. In one example, the heat-insulating member 370 may enable heat retention by propagation of heat towards the processing chip for faster heating. Further, a wiring harness 367 is coupled to the heater assembly 365. The wiring harness 367 may be connected to terminals 356, 357, 361, 362. The wiring harness may further include cables for heat sensing and other functions.

Figure 3B:
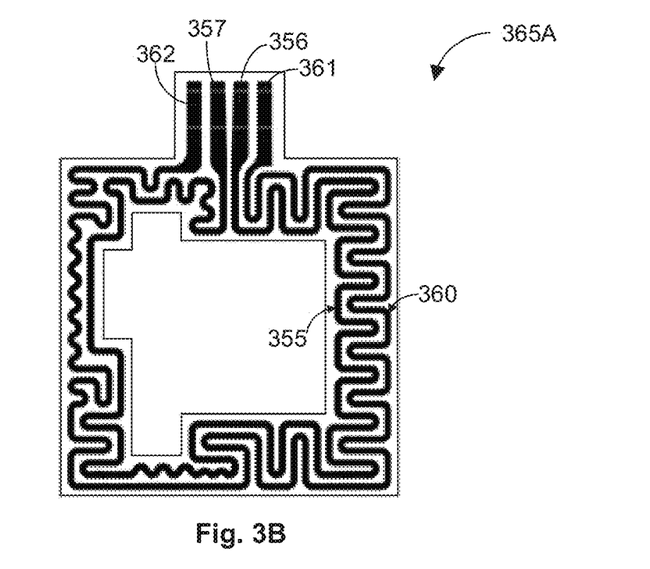
FIG. 3B illustrates a schematic view of an integrated support layer, in accordance with an example of the present subject matter.

FIG. 3B illustrates a schematic view of an integrated support layer, in accordance with an example of the present subject matter. The integrated support layer 365I may hold a first heating element 355 and a second heating element 360. In one example, the first heating element 355 and the second heating element 360 may be resistive type heaters. The first heating element 355 and the second heating element 360 may be in the form of strips with a liner pattern, zig-zag pattern, a combination thereof, or any other shape. In the illustrated example, the second heating element 360 is disposed radially outward with reference to the first heating element 355. A predefined gap is maintained between the first heating element 355 and the second heating element 360 throughout their length to maintain electrical isolation between them.

In the illustrated example, the first heating element 355 may have a lower heating capacity when compared to the second heating element 360. In one example, the first heating element 355 has a first surface area, and the second heating element 360 has a second surface area. The first surface area may be less than the second surface area. In another example, the first heating element 355 and the second heating element 360 may have uniform widths but the length of the second heating element 360 is greater than the first heating element 355. In a further example, the second heating element 360 may be selectively provided with a larger width, when compared to the first heating element 355, to obtain higher heating capacity. Further, in the illustrated example, the integrated support layer 365I has a square or rectangular shape with a cut-out at the center. The first heating element 355 and the second heating element 360 are routed about the integrated support layer 365I. In one example, heating elements 355, 360 have a pattern such that they are substantially asymmetric in any orientation.

In an assembled condition, the integrated support layer 365I surrounds at least a portion of a die of the processing chip. In one example, the processing chip may have more than one die, and the integrated support layer may be configured to conform to the shape of the die with aperture portions to accommodate the dies. In one example, the first heating element 355 comprises a pair of terminals 356, 357. Similarly, the second heating element 360 comprises a pair of terminals 361, 362. Each pair of terminals are functionally connected to a control device, which allocates power to the first heating element 355 and the second heating element 360 based on the heating requirement of the processing chip. The heater assembly 365 along with the processing chip may be supported on a circuit board assembly, which may be encased in a network device (housing).

Figure 4:
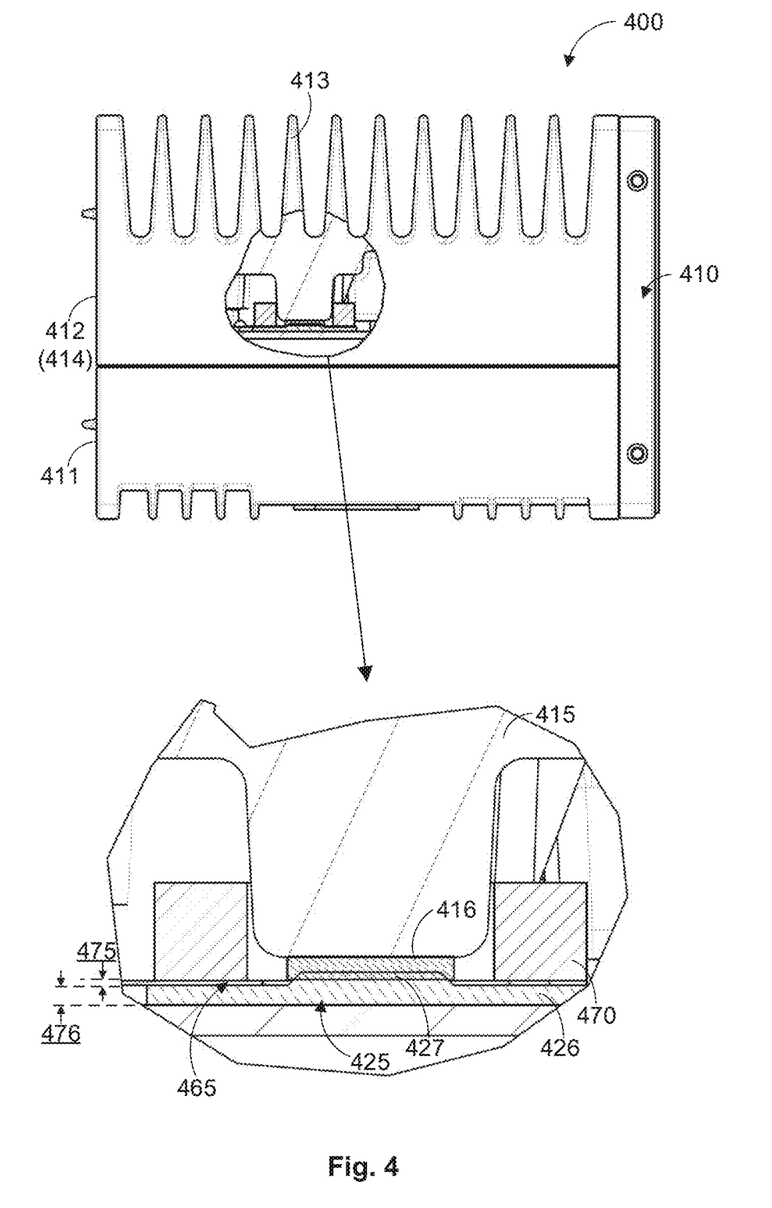
FIG. 4 illustrates a sectional view and an enlarged sectional view of a portion of a network device, in accordance with an example of the present subject matter.

FIG. 4 illustrates a sectional view (selected portion) and an enlarged sectional view of a portion of a network device, in accordance with an example of the present subject matter. The section may be taken partially along axis A-A', as illustrated in FIG. 2A The network device 400 comprises a housing 410 formed by a first portion 411 and a second portion 412. The second portion 412 is provided with a plurality of cooling fins 413 for dissipation of heat by convection. Similarly, the first portion 411, which acts as a base may be provided with a plurality of cooling fins. In the current example, the second portion 412 itself acts as a heat sink. To avoid ambiguity, a separate reference sign '414' is used for referring to the 'heat sink.' As in some examples, a structure, which is independent of the first portion/second portion may act as a heat sink.

The heat sink 414 comprises an extended structure 415, which extends from an inner surface of the heat sink 414 towards a processing chip 425. A thermal interface member 416 acts as an interface between the extended structure 415 and the processing chip 425. In one example, the thermal interface member 416 may be disposed between the processing chip 425 and extended structure 415. In other words, the thermal interface member 416 may be at least partially sandwiched between the extended structure 415 of heat sink 414 and the processing chip 425. Excess heat generated by the processing chip 425 during operation thereof may be transferred to the thermal interface member 416. From the thermal interface member 416, heat gets transferred to the extended structure 415 by way of conduction. From the extended structure 415, which is part of the heat sink 414, heat gets dissipated to the surrounding atmosphere via an exposed surface of the heat sink 414, e.g., via the cooling fins 413. In one example, the cooling fins 413 are elongated structures that are disposed parallel to each other. The plurality of cooling fins 413 may be integrally formed with the second portion 412. In some examples, the housing 410 may include a forced air-typed device, such as a fan, to assist in the removal of thermal energy from the housing 410.

Further, in the illustrated example, the processing chip 425 comprises a substrate 426 and a die 427, which is mounted to the substrate 426. In some examples, the heater assembly 465 is mounted to the substrate 426. A heat-insulating member 470 is mounted to the heater assembly 465 to confine heat and from escaping of heat from an outward-facing side of the heater assembly 465. In some examples, the die 427 is at an elevation from the substrate 426. In the illustrated example, the heater assembly 465 comprises a first thickness 475, which is substantially less than a second thickness 476 of the processing chip 425. Further, the heat-insulating member 470 is provided with substantial thickness, when compared to the first thickness 475 and the second thickness 476, for effective retention of heat. For example, the thickness of the heat-insulating member is 10-15 times the first thickness 475 of the heater assembly 465. The heater assembly 465 comprises an aperture portion, e.g., cut-out or opening, that accommodates the die, which is elevated, and the heater assembly 465 is at least partially seated on the substrate 426 and the heater assembly 465 at least partially surrounds the die 427. The extended structure 415 of the heat sink 414 extends through an opening provided in the heat-insulating member 470 and couples to the thermal interface member 416. The thermal interface member 416 abuts the die 427 of the processing chip and the thermal interface member 416 is disposed at an aperture portion of the heater assembly without any contact between the heater assembly 465 and the thermal interface member 416. Thus, a heating system, such as the heater assembly, is kept independent of a heat dissipating system, such as a heat sink.

Figure 5A:
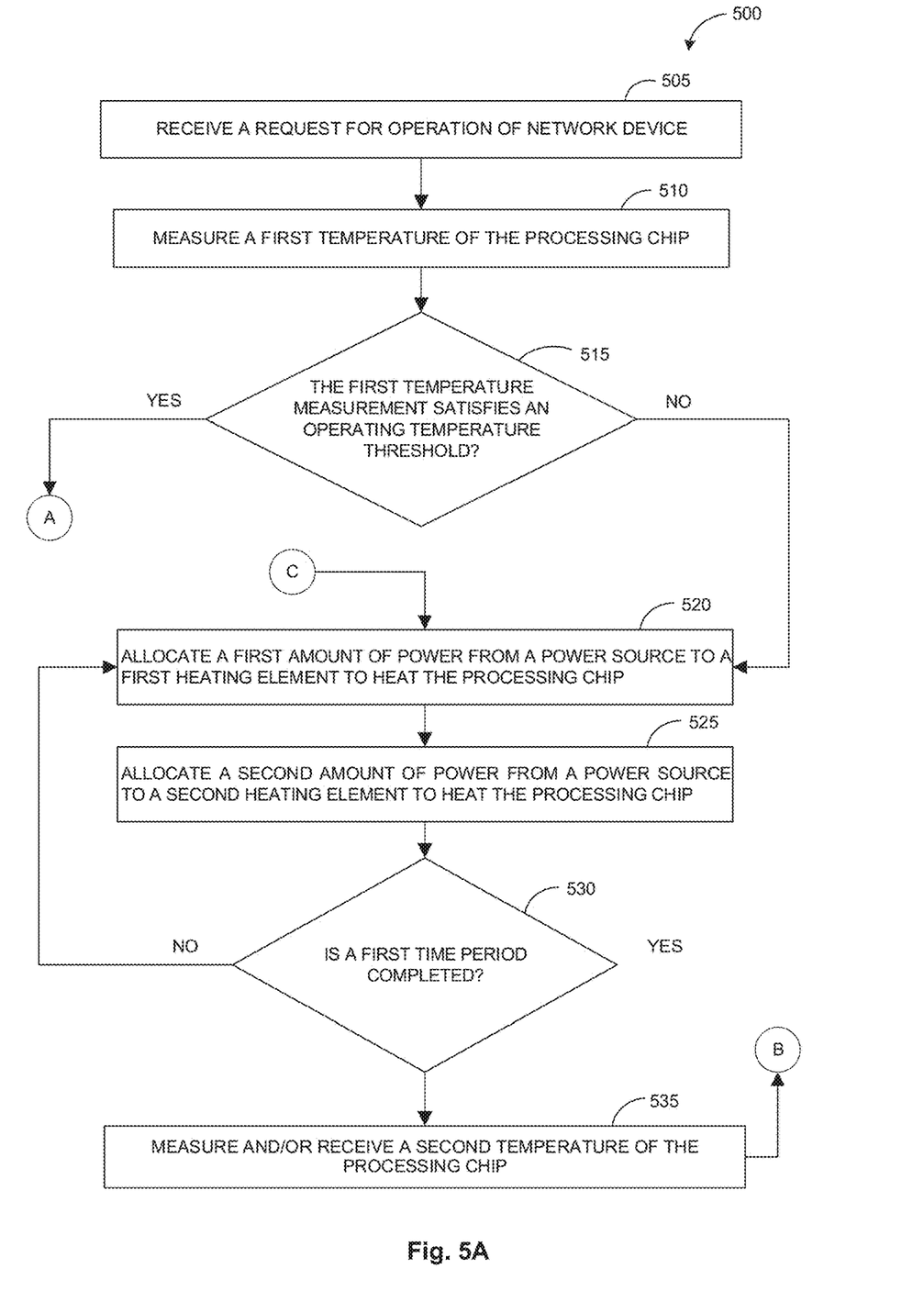
FIGS. 5A and 5B illustrate a method of allocation of power for a network device, in accordance with an example of the present subject matter.
Figure 5B:
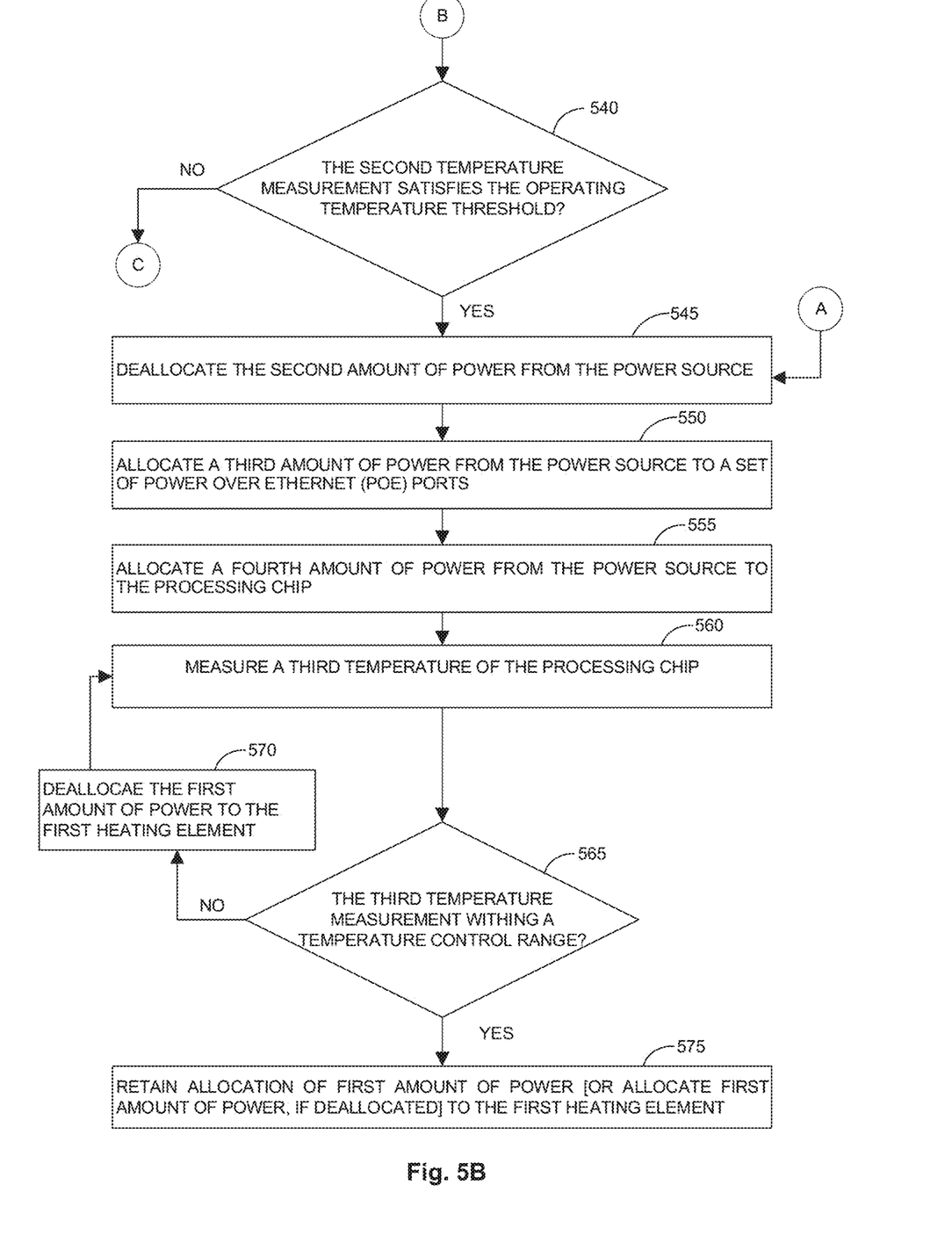

FIGS. 5A & 5B illustrate a method of allocation of power for a network device, with a greater level of detail, in accordance with an example of the present subject matter. The method is illustrated in the form of a flow diagram with blocks in a sequence, for ease of explanation. The blocks illustrated are not limited to the sequence. One or more blocks may be performed in an order other than the illustrated one. In some examples, certain blocks may be performed more than once.

At 505, a request may be received by a network device for operation thereof. The request may be any one of a local request for powering ON, by operating a start switch of the network device, or a digital signal. The request may be from a remote device and the request may be received on a wired or a wireless network.

At 510, the network device may measure a first temperature of a processing chip. The processing chip is a part of the network device and the processing chip may have to undergo boot up or boot startup for operation. In one example, the first temperature may be measured before the bootup of the processing chip. A converter device measures the first temperature and converts it into a signal (e.g., voltage signal). For example, a temperature to voltage converter may convert the first temperature into a proportionate voltage signal. In another example, a temperature to voltage converter may provide a high or low voltage output. Information related to the first temperature measurement may be sent to a control device of the network device.

At 515, the network device determines whether the first temperature measurement satisfies an operating temperature threshold. For example, the first temperature measurement may be compared with the operating temperature threshold or with an operating temperature range of the processing chip. The operating temperature threshold may be defined for each processing chip.

A control device may receive a first temperature measurement of the processing chip. For example, a temperature to voltage converter may send the temperature measurement related information or signal either directly or indirectly to the control device. Based on determining that the first temperature measurement does not satisfy the operating temperature threshold, at 520, the network device may allocate a first amount of power from a power source to operate a first heating element. At 525, the network device may allocate a second amount of power to a second heating element. In one example, actions illustrated in blocks 520 & 525 may be performed in parallel. In another example, actions illustrated in blocks may be performed in a sequence or with a pre-set time gap between them. For example, a predetermined time delay is maintained between the execution of blocks 520 and 525 or between the allocation of the first amount of power and the allocation of the second amount of power. In some examples, the predetermined time delay may range from 0 to 30 seconds. However, depending on the capacity of the heating elements, heating requirement, etc. the predetermined time delay may be varied. In one example, the heating capacity of the first heating element is lower than the second heating element, and correspondingly, the first amount of power is lesser than the second amount of power. In some examples, initially, any one of the first heating element and the second heating element provides heat to the processing chip. After the predetermined time delay, the first heating element and the second heating element collectively provide heat for bringing the temperature of the processing chip towards the operating temperature threshold in a shorter time. In one example, the operating temperature threshold is a minimum temperature required to enable the processing chip to operate. Allocation of the first amount of power & the second amount of power and determining of time delay may be controlled by the control device.

Whereas, based on determining that the first temperature measurement satisfies the operating temperature threshold, at 515, then block 545 may be performed. Block 545 is discussed in detail in the subsequent paragraphs.

At 530, the network device waits for a first time period. The first time period may be a predetermined time and is measured from the time of the first temperature measurement. Alternatively, the first time period may be measured from the time of operation of at least one of the first heating element and the second heating element, which is based on determining that the first temperature does not satisfy the operating temperature threshold.

In another example, the first time period is not predefined but is based on one or more of an ambient temperature, a heating capacity of the first heating element, a heat capacity of the second heating element, and the first temperature. In a first example, if the ambient temperature is very low (e.g., −70 degrees Celsius) and the first heating element and the second heating element have a low rating, then the first time period may be relatively longer, for example, greater than 30 seconds. In a second example, if the ambient temperature is moderate (e.g., −30 degrees Celsius) and the first heating element and the second heating element have a high rating (with reference to the first example), the first time period may be relatively shorter, for example, less than 30 seconds. The rating of the heating elements may be based on the power consumption (wattage) of the heating elements.

At 535, after the first time period, the control device receives a second temperature of the processing chip. In a further example, the second temperature may be measured periodically in order to check temperature rise. The converter device measures the second temperature and converts the temperature into a signal. The signal corresponding to the second temperature may be provided as an input to the control device, of the network device. In some examples, upon identification of a sudden surge in temperature, power allocation to one of the heating elements may be deallocated.

At 540, the network device determines whether the second temperature measurement satisfies the operating temperature threshold. Based on determining that the second temperature measurement satisfies the operating temperature threshold, at 540, the network device may deallocate the second amount of power to the second heating element. At 550, the network device allocates a third amount of power from the power source to a set of PoE ports, from a plurality of ports. At 555, the network device may allocate a fourth amount of power from the power source to the processing chip for operation thereof. In other words, the network device performs reallocation of power by limiting or discontinuing power allocation to the first heating element and the second heating element.

At 560, the network device measures a third temperature of the processing chip. The third temperature may be measured once the processing chip is in an operating state (second condition). At 565, the network determines whether the third temperature measurement is within a temperature control range. For example, if the operating temperature threshold is zero degrees Celsius then the temperature control range may be −5 to 10 degrees Celsius, as per one example. In response to determining that the third temperature does not fall in the temperature control range, at 570, the network device through the control device may deallocate the first amount of power to the first heating element and utilize power budget for the operation of the network device.

The temperature of the processing chip falling within the temperature control range may indicate a possibility that the temperature of the processing may fall below the operating temperature threshold. Thus, in response to determining that the third temperature measurement falls within the temperature control range, as a preventive action, at 575, the network device retains allocation of the first amount of power to the first heating element, in such selected conditions. Alternatively, in certain conditions, if the deallocation of the first amount of power has occurred, then, at 575, the network device reallocates the first amount of power to the first heating element to retain/increase the temperature of the processing chip. The network device of the present subject matter effectively performs power management thereby allocating power budget to the essential operations of the network device and at the same time reducing the heating time of the processing chip.

In some examples, the network device may be any article that includes a machine-readable storage medium. The machine-readable storage may be non-transitory storage type and is communicatively coupled to at least one processing resource through a system bus. The processing resource may be the processing chip or any type of Central Processing Unit (CPU), microprocessor, or processing logic that interprets and executes machine-readable instructions stored in machine-readable storage medium. Machine-readable storage medium may be a random-access memory (RAM) or another type of dynamic storage device that may store information and machine-readable instructions that may be executed by processor. For example, machine-readable storage medium may be Synchronous DRAM (SDRAM), Double Data Rate (DDR), Rambus DRAM (RDRAM), Rambus RAM, etc. or storage memory media such as a floppy disk, a hard disk, a CD-ROM, a DVD, a pen drive, and the like.

In an example, the blocks 505-575 may be instructions and the machine-readable storage medium may store them in the form of machine-readable instructions (i.e. program code) that, when executed by processor, may at least partially implement some or all functions of article, as discussed in the flow-diagram 500.

In an example, instructions 505-575 may be executed by the article, such as a computing system or the network device, to define allocate and/or deallocate power to various components, including a first heating element, the second heating element, the processing chip, the set of PoE ports, etc., of the article with short wait time during heating and effective utilization of power form the power source of the article.

It should be understood that the above-described examples are merely illustrative of some of the many specific examples that represent the principles described herein. Those skilled in the art can readily devise numerous other arrangements without departing from the scope as defined by the following claims.

We claim:

1. A method comprising:
   receiving a first temperature measurement of a processing chip of a network device;
   based on determining that the first temperature measurement does not satisfy an operating temperature threshold:
      allocating, by the network device, a first amount of power from a power source of the network device to a first heating element of the network device to heat the processing chip; and
      allocating, by the network device, a second amount of power from the power source to a second heating element of the network device to heat the processing chip;
   receiving a second temperature measurement of the processing chip;
   based on determining that the second temperature measurement satisfies the operating temperature threshold:
      allocating, by the network device, a third amount of power from the power source to a set of power over ethernet ports of the network device; and
      allocating, by the network device, the first amount of power from the power source selectively to the first heating element to heat the processing chip.

2. The method of claim 1, wherein a predetermined time delay is maintained between allocation of the first amount of power to the first heating element and allocation of the second amount of power to the second heating element.

3. The method of claim 1, wherein the first temperature measurement is received prior to bootup of the processing chip, and the second temperature measurement is received after a first time period from when the first temperature measurement is received.

4. The method of claim 3, wherein the first time period is determined based on one or more of an ambient temperature, a heating capacity of the first heating element, a heat capacity of the second heating element, or the first temperature measurement.

5. The method of claim 1, wherein allocating power from the power source selectively to the first heating element based on determining that the second temperature measurement satisfies the second condition, comprises:
   receiving a third temperature measurement of the processing chip; and
   determining that the third temperature measurement of the processing chip falls within a temperature control range of the processing chip.

6. The method of claim 1, comprising:
   based on determining that the second temperature measurement satisfies the operating temperature threshold:
      deallocating, by the network device, the second amount of power to the second heating element;
   wherein the second amount of power is included in at least a portion of the third amount of power;

allocating, by the network device, a fourth amount of power from the power source to the processing chip for operation of the processing chip; and wherein a sum of the first amount of power, the third amount of power, and the fourth amount of power is greater than a sum of the first amount of power and the second amount of power.

7. A network device comprising:
a processing chip;
a heater assembly comprising:
   a first heating element; and
   a second heating element;
a power source to power the processing chip, the first heating element, the second heating element, and a plurality of power over ethernet ports of the network device; and
a control device comprising hardware or circuitry that is configured to:
   determine that a first temperature measurement of the processing chip does not satisfy an operating temperature threshold;
   based on determining that the first temperature measurement does not satisfy the operating temperature threshold:
      allocate a first amount of power from the power source to the first heating element to heat the processing chip; and
      allocate a second amount of power from the power source to the second heating element to heat the processing chip; and
   determine that a second temperature measurement of the processing chip satisfies the operating temperature threshold; and
   based on determining that the second temperature measurement satisfies the operating temperature threshold:
      allocate a third amount of power from the power source to a set of power over ethernet ports, out of the plurality of power over ethernet ports; and
      allocate the first amount of power from the power source selectively to the first heating element to heat the processing chip.

8. The network device of claim 7, wherein the processing chip comprises a substrate and die that is disposed on the substrate, wherein the first heating element and the second heating element at least partially surround an outer periphery of the die.

9. The network device of claim 8, wherein the first heating element and the second heating element are supported on an integrated support layer of the heater assembly, wherein the heater assembly is at least partially seated on the substrate.

10. The network device of claim 9, wherein the integrated support layer is disposed along a first plane, and the first heating element and the second heating element are disposed along the first plane, and the first heating element is disposed radially outward with reference to the second heating element.

11. The network device of claim 9, wherein the integrated support layer, the first heating element, and the second heating element are disposed between a first heat-resistive layer and a second heat-resistive layer of the heater assembly.

12. The network device of claim 11, wherein the integrated support layer is coupled to a conductive layer, of the heater assembly, through the first heat-resistive layer, and a heat-insulating member is disposed adjacent to an outward-facing side of the second heat-resistive layer.

13. The network device of claim 12, wherein the conductive layer is coupled to the first heating element and the second heating element to spread heat across the conductive layer when at least one of the first heating element or the second heating element is operational.

14. The network device of claim 7, wherein the first heating element has a first surface area and the second heating element has a second surface area, and wherein the first surface area is less than the second surface area.

15. The network device of claim 7, further comprises:
a housing, the housing comprising:
   a heat sink; and
   a circuit board assembly,
   wherein the circuit board assembly supports the processing chip and the circuit board assembly is supported and encased by the housing;
   the processing chip comprises: a substrate and a die, wherein the die is disposed on the substrate; and
   the heat sink is coupled to the die of the processing chip and the heater assembly is coupled to the substrate of the processing chip.

16. The network device of claim 15, wherein the heat sink comprises an extended structure and the extended structure is coupled to the die of the processing chip through a thermal interface member.

17. The network device of claim 16, wherein the thermal interface member is disposed to abut the die of the processing chip and the thermal interface member is disposed at an aperture portion of the heater assembly without any contact between the heater assembly and the thermal interface member.

18. The network device of claim 15, wherein the heater assembly is at least partially seated on the substrate of the processing chip and the heater assembly comprises an aperture portion to accommodate the die of the processing chip.

19. The network device of claim 7, wherein the control device includes a temperature sensing circuit and a switching circuit, wherein the temperature sensing circuit is coupled to the processing chip to determine the first temperature measurement and the second temperature measurement, and the switching circuit operates at least one of the first heating element and the second heating element.

20. An article comprising:
at least one non-transitory machine-readable storage medium comprising instructions executable by at least one processing resource to:
   receive a first temperature measurement of a processing chip of a network device;
   based on determining that the first temperature measurement does not satisfy an operating temperature threshold:
      allocate a first amount of power from a power source of the network device to a first heating element of the article to heat the processing chip; and
      allocate a second amount of power from the power source to a second heating element of the network device to heat the processing chip;
   receiving a second temperature measurement of the processing chip;
   based on determining that the second temperature measurement satisfies the operating temperature threshold:
      allocate a third amount of power from the power source to a set of power over ethernet ports of the network device; and allocate the first amount of power from the power source selectively to the first heating element to heat the processing chip.

\* \* \* \* \*